United States Patent [19]
Gardner et al.

[11] Patent Number: 5,943,596
[45] Date of Patent: Aug. 24, 1999

[54] FABRICATION OF A GATE ELECTRODE STACK USING A PATTERNED OXIDE LAYER

[75] Inventors: Mark I. Gardner, Cedar Creek; Mark C. Gilmer, Austin, both of Tex.

[73] Assignee: Advanced Micro Devices, Austin, Tex.

[21] Appl. No.: 08/927,097

[22] Filed: Aug. 29, 1997

[51] Int. Cl.$^6$ .............................................. H01L 21/3205
[52] U.S. Cl. ...................... 438/585; 438/778; 438/197; 438/426; 438/697
[58] Field of Search .................................... 438/585, 778, 438/197, 426, 697; 257/288

[56] References Cited

U.S. PATENT DOCUMENTS 5,679,599  10/1997  Mehta ........................................ 438/425
5,738,731  4/1998  Shindo et al. ........................... 136/249
5,786,256  6/1998  Gardner et al. .......................... 438/305

*Primary Examiner*—John F. Niebling
*Assistant Examiner*—John Murphy
*Attorney, Agent, or Firm*—Merchant & Gould P.C.

[57] ABSTRACT

A semiconductor device having a gate electrode stack formed using a patterned oxide layer is disclosed. The device is formed by forming an oxide layer over a surface of a substrate and forming at least one opening in the oxide layer. A high permittivity plug (e.g., a BST plug) is formed in the lower portion of the opening. A conductive plug (e.g., a metal silicide plug) is formed in an upper portion of the opening over the high permittivity plug. Remaining portions of the oxide layer are then removed. The conductive plug and high permittivity plug may form a gate electrode and a gate insulating layer, respectively.

24 Claims, 8 Drawing Sheets ns of the semiconductor device. For example, spacers must be provided on the resultant electrode structure prior to silicidation of the gate electrode and adjacent active regions in order to prevent shorting the gate electrode to the active regions. As a result, alternative techniques for forming the gate electrode and gate insulating layer are needed.

FABRICATION OF A GATE ELECTRODE STACK USING A PATTERNED OXIDE LAYER

FIELD OF THE INVENTION

The present invention is directed generally to semiconductor devices and, more particularly, to a semiconductor device and fabrication method in which a gate electrode stack is formed using a patterned oxide layer.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applicability and numerous disciplines. One such silicon-based semiconductor device is a metal-oxide-semiconductor (MOS) transistor.

The principal elements of a typical MOS semiconductor device are illustrated in FIG. 1. The device generally includes a gate electrode 101, which acts as a conductor, to which an input signal is typically applied via a gate terminal (not shown). Heavily doped source 103 and drain 105 regions are formed in a semiconductor substrate 107 and are respectively connected to source and drain terminals (not shown). A channel region 109 is formed in the semiconductor substrate 107 beneath the gate electrode 101 and separates the source 103 and drain 105 regions. The channel is typically lightly doped with a dopant type opposite to that of the source 103 and drain 105 regions. The gate electrode 101 is physically separated from the semiconductor substrate 107 by a gate insulating layer 111, typically an oxide layer such as $SiO_2$. The insulating layer 111 is provided to prevent current from flowing between the gate electrode 101 and the semiconductor source region 103, drain region 105 or channel region 109.

In operation, an output voltage is typically developed between the source and drain terminals. When an input voltage is applied to the gate electrode 101, a transverse electric field is set up in the channel region 109. By varying the transverse electric field, it is possible to modulate the conductance of the channel region 109 between the source region 103 and drain region 105. In this manner an electric field controls the current flow through the channel region 109. This type of device is commonly referred to as a MOS field-effect-transistors (MOSFET).

Semiconductor devices, like the one described above, are used in large numbers to construct most modern electronic devices. In order to increase the capability of such electronic devices, it is necessary to integrate even larger numbers of such devices into a single silicon wafer. As the semiconductor devices are scaled down (i.e., made smaller) in order to form a larger number of devices on a given surface area, the structure of the devices and fabrication techniques used to make such devices must be altered.

One important step in the manufacture of MOS devices is the formation of the gate electrode and the gate insulating layer. Typically, this is done by first growing a layer of silicon dioxide (usually 30 to 40 angstroms thick) over the substrate. Next, a polysilicon layer is deposited over the silicon dioxide layer and etched to form a gate electrode. Etching of the polysilicon layer is typically performed using well-known photolithography and etching techniques. This conventional technique for forming the gate electrode and gate insulating layers however imposes limitatio

SUMMARY OF THE INVENTION

Generally, the present invention relates to a semiconductor device having a gate electrode stack formed using a patterned oxide layer. Consistent with the present invention a semiconductor device is formed by forming an oxide layer over a surface of a substrate and forming at least one opening in the oxide layer. A high permittivity plug is formed in a lower portion of the opening. A conductive plug is formed in an upper portion of the opening over the high permittivity plug. Remaining portions of the oxide layer are then removed. The conductive plug and high permittivity plug may, for example, operate as a gate electrode and gate insulating layer, respectively.

In accordance with one aspect of the invention, the conductive plug is formed from a metal silicide, such as a cobalt silicide, and the high permittivity plug is formed from a barium strontium titanate (BST) oxide. The BST oxide has a higher permittivity than silicon dioxide and thus allows for scaling of the gate insulating layer as compared to conventional gate oxides.

The above summary of the present invention is not intended to describe each illustrated embodiment or every implementation of the present invention. The Figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
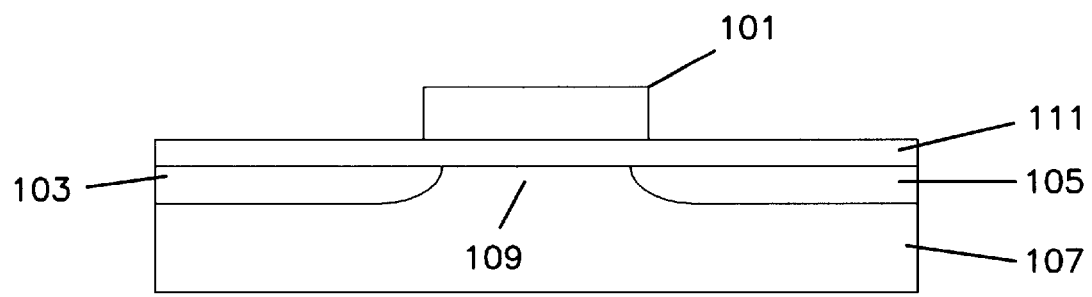
FIG. 1 illustrates components of a MOS semiconductor device.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to a number of semiconductor devices which utilize a gate electrode stack (i.e., a gate electrode disposed on a gate insulating layer). The invention has been found to be particularly advantageous in application environments where it is desirable to form a gate electrode stack used in a MOS device. While the present invention is not so limited, an appreciation of various aspects of the invention is best gained through a discussion of various application examples of processes used to form such semiconductor devices.

Figure 2A:
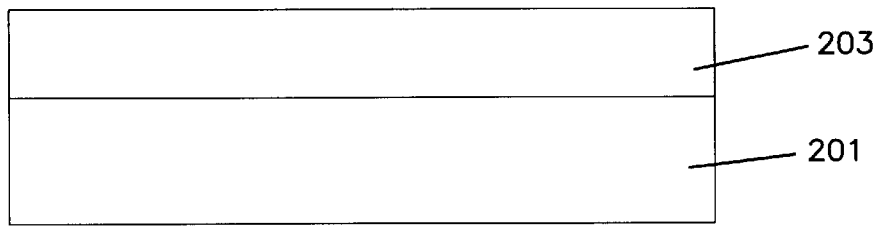
FIGS. 2A through 2I illustrate a fabrication process in accordance with an embodiment of the invention.

With reference to FIGS. 2A–2I, one exemplary process for forming a gate electrode stack using a patterned oxide layer will be described. In FIG. 2A, an oxide layer 203 is formed over the surface of a substrate 201. The substrate 201 is typically a silicon substrate. The oxide layer is typically a silicon dioxide layer formed using a number of different known techniques. For example, a silicon dioxide layer 203 may be formed by chemical vapor deposition (CVD) reaction of silane and oxygen or by plasma enhanced CVD (PECVD) reaction of $N_2O$ and silane.

As will be discussed further below, the oxide layer 203 will be used to form a gate electrode stack. The thickness of the oxide layer 203 is selected in consideration of the desired thickness of the gate electrode stack. Suitable thicknesses of the oxide layer 203 range from about 300 to 500 angstroms (Å) for many applications.

Figure 2B:
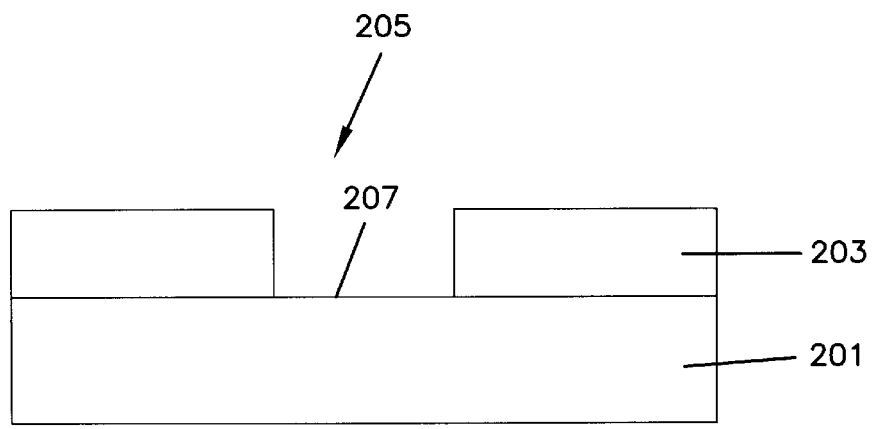

Portions of the oxide layer 203 are selectively removed to form openings (only one of which is shown) in the oxide layer 203. The opening 205 typically exposes an active region 207 of the substrate 201 which will operate as a channel region. The resultant structure is illustrated in FIG. 2B. Formation of the opening 205 may, for example, be done using well-known photolithography and etching techniques and equipment.

The opening 205 will be used to form a gate electrode stack. The width of the opening 205 is selected in consideration of the desired width of the gate electrode stack. The desired width of the gate electrode stack can vary depending on the type of device being fabricated. In many cases, the width of the opening 205 is formed at the minimum resolution (presently about 0.15 microns) of the photolithography and etching techniques employed. In general, suitable widths of the opening 205 (and thus the gate electrode stack) range from about 0.15 to 0.25 microns for many applications. The invention however is not limited to these particular widths. Larger openings may be formed if desired. In addition, as the minimum resolution of photolithography processes is reduced, widths smaller than 0.15 microns are anticipated and intended to be covered by the invention.

Figure 2C:
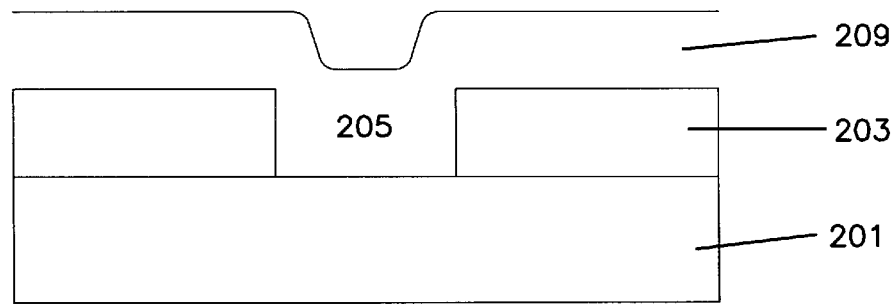

A layer of high permittivity material 209 is formed over the substrate 201 to at least partially fill the opening 205. The resultant structure is illustrated in FIG. 2C. The high permittivity layer 209 generally has a dielectric constant which is greater than the dielectric constant of silicon dioxide, which is about 4.2. Typically, the permittivity or dielectric constant of the high permittivity layer 209 ranges from about 20 to 300. The high permittivity layer 209 is also typically formed out of a material which can be selectively removed with respect to the oxide layer 203. In the example embodiment, the high permittivity material 209 is a barium strontium titanate (BST) oxide ($Ba_{1-x}Sr_xTiO_3$). The BST oxide may, for example, be deposited at approximately 700° C. using metal-organic chemical vapor deposition (MOCVD), jet vapor deposition, or RF sputtering. However, the invention, is not so limited. For example, other high permittivity materials such as tantalum oxide, lead zirconate titanate (PZT) or lead lanthanum zirconate titanate (PLZT) may be used instead of BST oxide. Suitable thicknesses for the high permittivity layer 209 range from about 700 to 3000 Å for many applications.

Figure 2D:
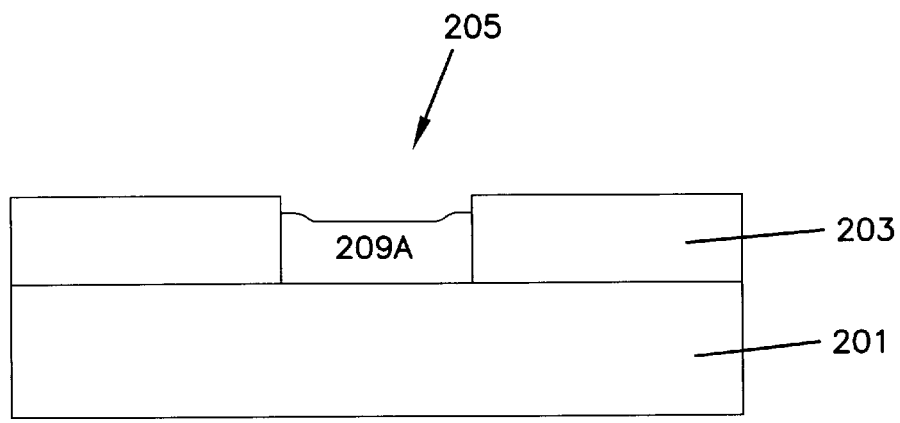

Portions of the high permittivity layer 209 are removed to leave a remaining portion or plug 209A in the opening 205. The resultant structure is illustrated in FIG. 2D. The high permittivity layer 209 may be selectively removed using a polishing technique in which the high permittivity layer 209 is slightly overpolished such that the upper surface of the plug 209A lies slightly below the upper surface of the oxide layer 203. For example, the high permittivity plug 209A may recessed by about 50 Å with respect to the oxide layer 203.

The polishing technique used to remove the high permittivity layer 209 is highly selective to the oxide layer 203. Suitable polishing techniques include, for example, known chemical-mechanical polishing (CMP) techniques. These CMP techniques generally involve a combination of chemical etching and physical abrasion.

Figure 2E:
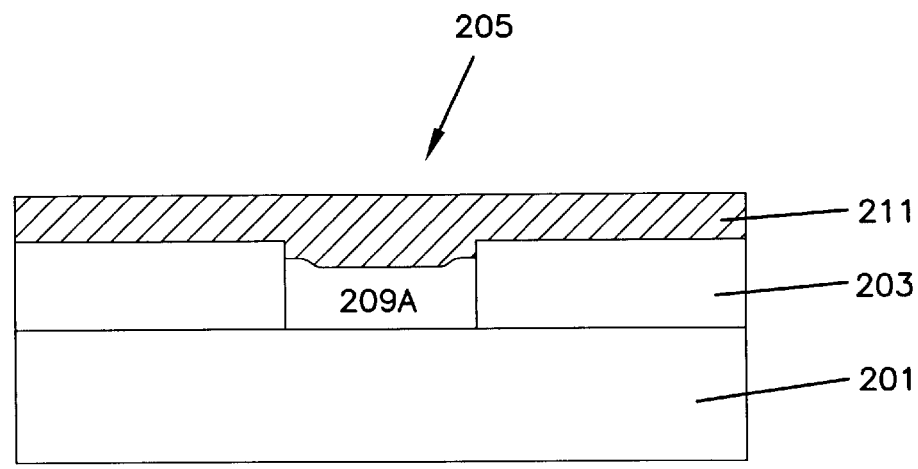

A conductive layer 211 is formed over the substrate 201, as illustrated in FIG. 2E. The conductive layer 211 generally fills the recess in the opening 205 and typically covers the oxide layer 203 as well. Suitable thicknesses of the conductive layer 211 range from about 500 to 1000 Å for many applications.

In the example embodiment, the conductive layer 211 is formed from a metal silicide such as a cobalt or tungsten silicide. The metal silicide may be deposited using, for example, well-known deposition techniques. In alternate embodiments, the conductive layer 211 may be a polysilicon layer formed using, for example, well-known deposition techniques.

Figure 2F:
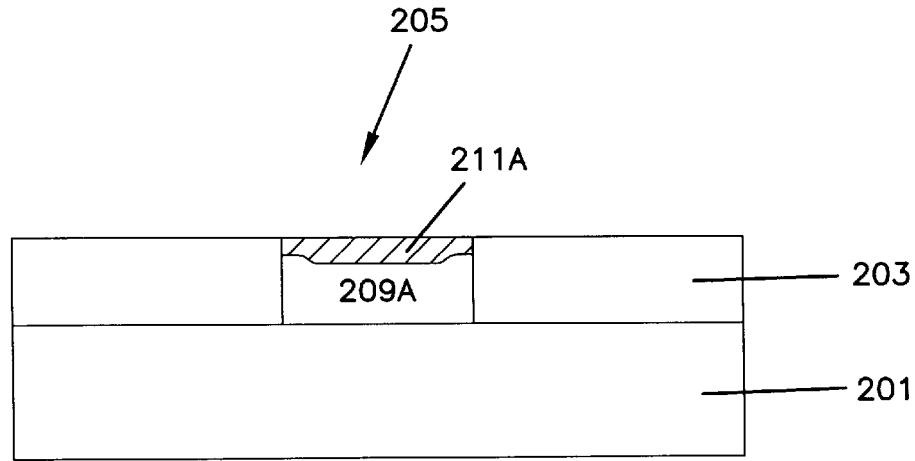

Portions of the conductive layer 211 are then removed to leave a remaining portion or conductive plug 211A in the oxide layer opening 205. The resultant structure is illustrated in FIG. 2F. Typically, the conductive layer is removed using a polishing technique, such as CMP, which planarizes the upper surface of the conductive portion 211A with the upper surface of the oxide layer 203. Generally, the high permittivity plug 209A will be used as a gate insulating layer, while the conductive plug 211A will operate as a gate electrode. Collectively, the conductive plug 211A and high permittivity plug 209A will be referred to as a gate electrode stack.

Figure 2G:
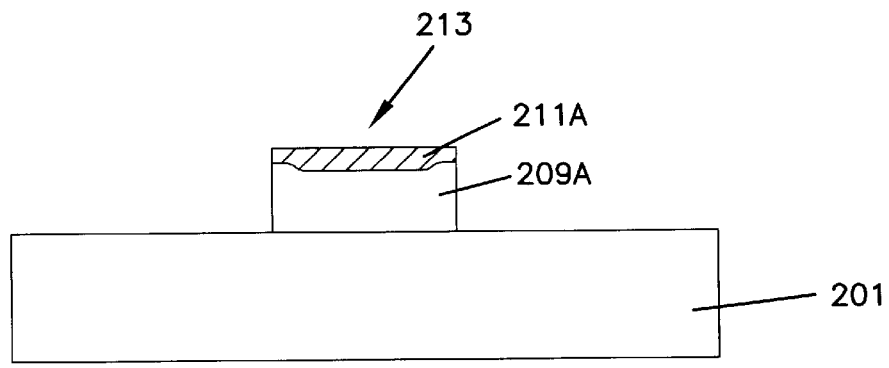

The remaining portions of the oxide layer 203 are then removed while leaving the gate electrode stack 213 intact. The resultant structure is illustrated in FIG. 2G. The removal of the oxide layer 203 adjacent the gate electrode stack 213 may be done using a number of different techniques which are selective to the conductive plug 211A and the high permittivity plug 209A. In one embodiment, these portions of the oxide layer 203 are removed using a wet etchant, such as a hydrofluoric acid (HF) solution. One suitable HF solution includes water and hydrogen fluoride in a volume ratio (water:hydrogen fluoride) of about 10:1. However, it should be appreciated that other etching techniques may alternatively be used.

Figure 2H:
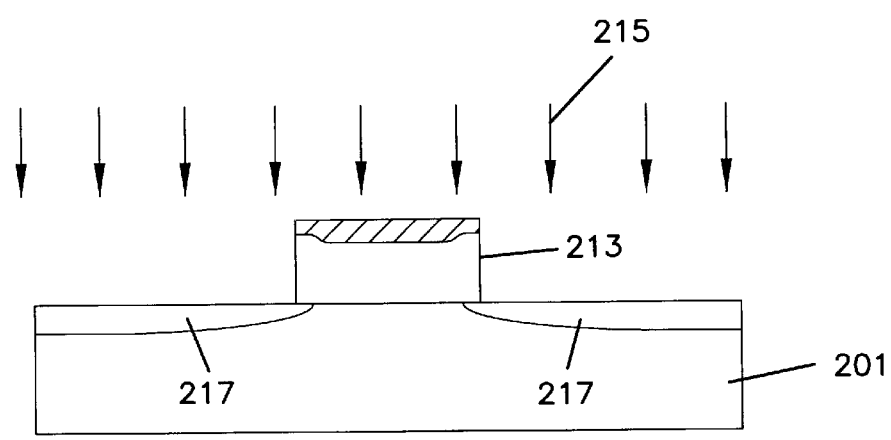

Fabrication may continue with well-known processes, such as spacer formation, source/drain implants, and contact formation to form the ultimate device structure. An exemplary process illustrating the formation of an LDD (lightly-doped drain) device is illustrated by way of example in FIGS. 2H and 2I. In FIG. 2H, a relatively shallow implant of a doping agent 215 (such as boron or arsenic) is performed to form lightly-doped regions 217 in the substrate 201. The shallow implant may be performed using known dosages, implant energies and implant techniques.

Figure 2I:
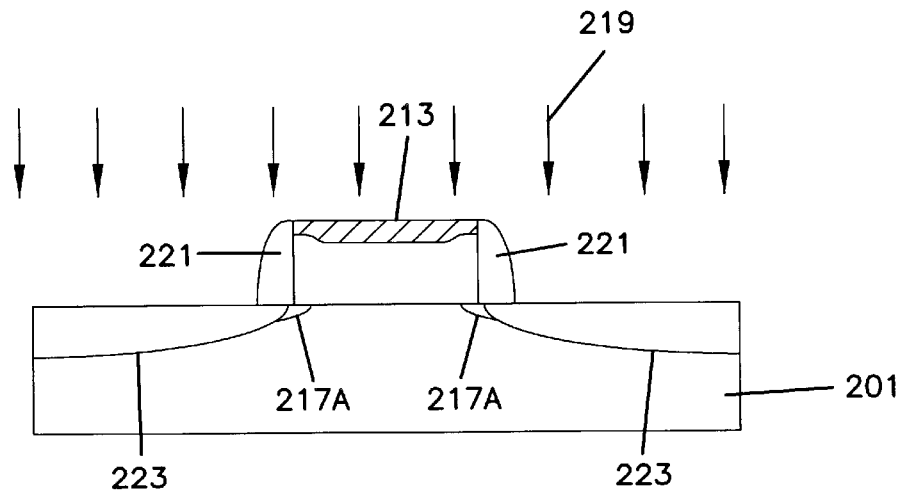

Following the shallow dopant implant, spacers 221 are formed on the sidewalls of the gate electrode stack 213. Using the spacers 221 for alignment, a relatively high dose implant of a doping agent 219 is performed to form heavily-doped regions 223 in the substrate 201. The resultant structure is illustrated in FIG. 2I. Together each heavily doped region 223 and lightly-doped region 217A forms a LDD source/drain region.

Using the above process, a gate electrode stack may be formed using a patterned oxide layer. The openings in the oxide layer allow for easy alignment of the gate insulating layer with the gate electrode. In particular, by recessing a gate insulating layer within an oxide layer opening, a metal silicide may be efficiently used as a gate electrode. For example, polysilicon is not needed to align the metal silicide.

Another advantage of the above-described fabrication process results from the use of a high permittivity material to form the gate insulating layer. In particular, the high permittivity material can provide a gate insulating layer having a thickness which is equivalent to 5 to 10 Å or less of silicon dioxide. The scaled thickness of the gate insulating layer enhances device performance by, for example, increasing drive current of the device.

Figure 3A:
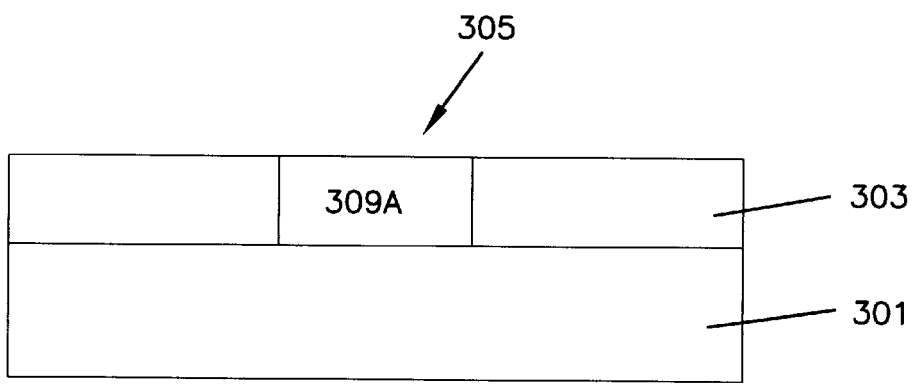
FIGS. 3A through 3E illustrate a fabrication process in accordance with another embodiment of the invention.

Turning now to FIGS. 3A–3D, there is illustrated an exemplary process for using a patterned oxide layer to form a gate electrode stack having a thin high permittivity gate insulating layer. Consistent with this process, a patterned oxide layer 303 having one or more openings (only one of which is shown) is formed over a substrate 301. A layer of high permittivity material (e.g., BST oxide) is formed over the patterned oxide layer and removed to form a high permittivity plug 309A in the opening 305. The resultant structure is illustrated in FIG. 3A. Formation of the patterned oxide layer 303 and high permittivity plug 309A may, for example, generally be performed in a similar manner as discussed above with respect to FIGS. 2A–2C with the high permittivity plug 309A being planarized with the surface of the patterned oxide layer 303. In alternate embodiments, the high permittivity plug 309A may be slightly recessed with respect to the patterned oxide layer 303A using an overpolishing technique as discussed above.

Figure 3B:
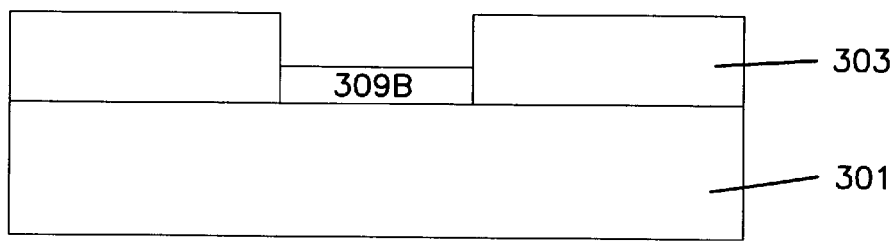

A portion of the high permittivity plug 309A is removed to form a thin high permittivity plug 309B, as illustrated in FIG. 3B. This may be done using etchants and etching techniques which are selective to the oxide layer 303. For example, the thin high permittivity plug 309B may be formed by etching the high permittivity plug 309A with a plasma-chemistry solution. By following the polishing technique used to form the high permittivity plug 309A with an etching technique to form a thin high permittivity plug 309B, the upper surface of the resultant plug 309B may be more planarized. The amount of the high permittivity plug 309A which is removed is selected in consideration of the desired final thickness of the thin high permittivity plug 309B. The minimum thickness of the thin high permittivity plug 309B is typically limited by reliability concerns and may, for example, be as thin as 10 to 15 Å. It is noted that 10 to 15 Å of BST oxide is typically equivalent to less than 1 Å of $SiO_2$, depending on the dielectric constant of the BST oxide employed.

Figure 3C:
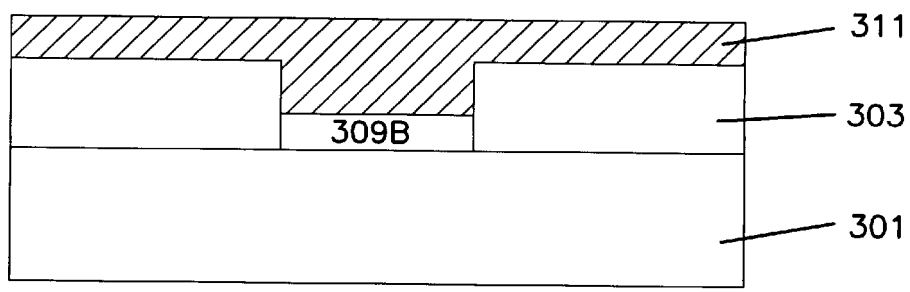
Figure 3D:
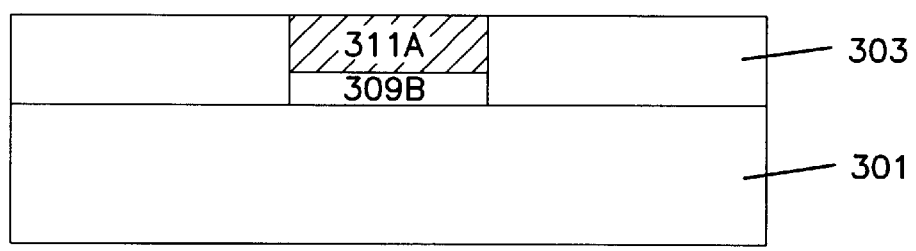
Figure 3E:
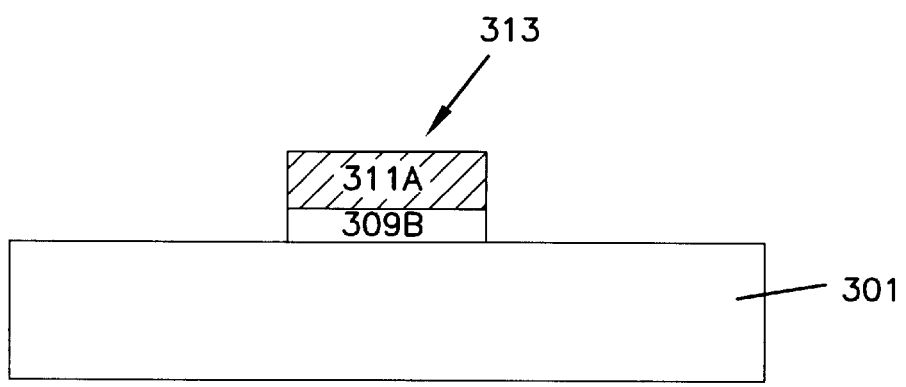

Following the formation of the thin high permittivity plug 309B, a conductive layer 311 is formed over the substrate 301, as illustrated in FIG. 3C. Portions of the conductive layer 311 are then removed to form a conductive plug 311A, as illustrated in FIG. 3D. Formation and removal of the conductive layer 311 may be done in a similar manner as discussed above with respect to conductive layer 211. The remaining portions of the oxide layer 303 are then removed, as illustrated in FIG. 3E. This oxide removal step may be performed in a similar manner as discussed above. The resultant structure comprises a gate electrode stack 313 which is formed by the thin high permittivity plug 309B (functioning as the gate insulating layer) and the conductive plug 311A (functioning as a gate electrode).

Fabrication may continue with well-known fabrication processes, such as spacer formation, source/drain region formation, contact formation and so forth to complete the ultimate device structure. In one example, the fabrication steps illustrated in FIGS. 2H and 2I are carried out to form an LDD device.

Figure 4A:
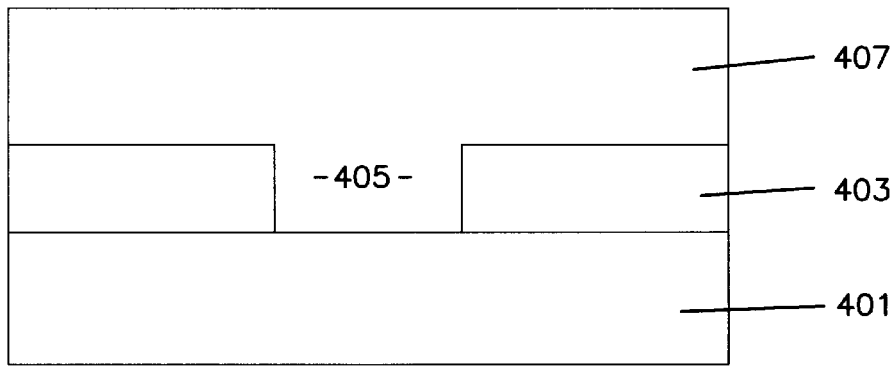
FIGS. 4A through 4E illustrate a fabrication process in accordance with still another embodiment of the invention.

Turning now to FIGS. 4A–4D, there is illustrated another exemplary process for using a patterned oxide layer to form a gate electrode stack having a thin high permittivity gate insulating layer. Consistent with this process, a patterned oxide layer 403 having one or more openings (only one of which is shown) is formed over a substrate 401. The patterned oxide layer 403 may, for example, be formed as discussed above. A relatively thick high permittivity layer 407 is formed over the oxide layer 403 and the opening 405. The resultant structure is illustrated in FIG. 4A.

With the exception of its thickness, the high permittivity layer 407 may be formed using materials and techniques similar to those discussed above. The thickness of the high permittivity layer 207 is typically sufficiently thick to form a relatively planar upper surface. Suitable thicknesses range from about 2000 to 4000 angstroms, for example.

Figure 4B:
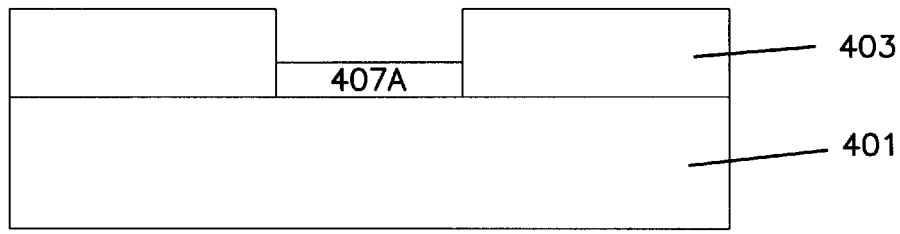

The high permittivity layer is selectively removed to form a thin a thin high permittivity plug 407A, as illustrated in FIG. 4B. This may be done using etchants and etching techniques which are selective to the oxide layer 403. For example, the thin high permittivity plug 407A may formed by etching the high permittivity layer 407 with a plasma-chemistry solution. By forming a relatively planar high permittivity layer prior to etching, the upper surface of the resultant plug 407A may also be relatively planar. The thickness of the high permittivity plug 407A is selected in consideration of the desired separation between the substrate 401 and a gate electrode. The minimum thickness of the thin high permittivity plug 407A is typically limited by reliability concerns and may, for example, be as thin as 10 to 15 Å. As noted above, 10 to 15 Å of BST oxide is typically equivalent to less that 1 Å of $SiO_2$, depending on the dielectric constant of the BST oxide employed.

Figure 4C:
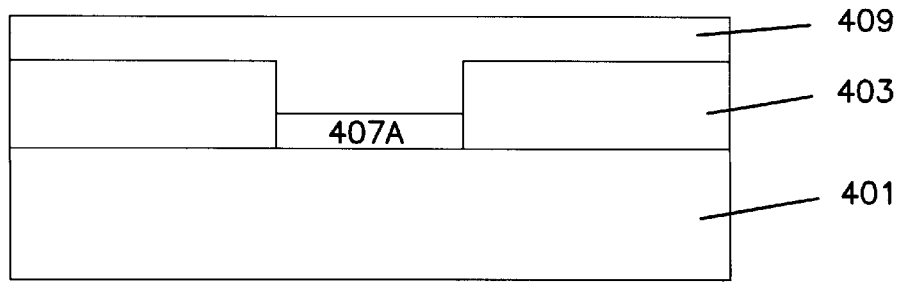
Figure 4D:
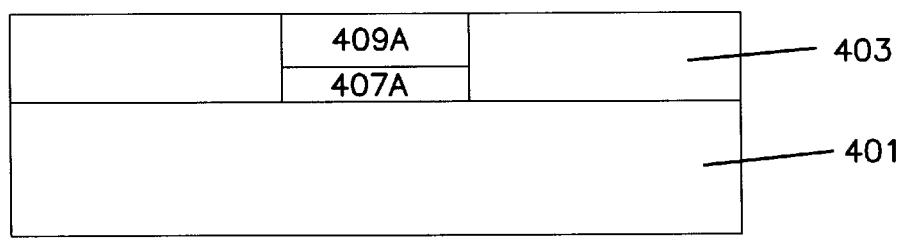
Figure 4E:
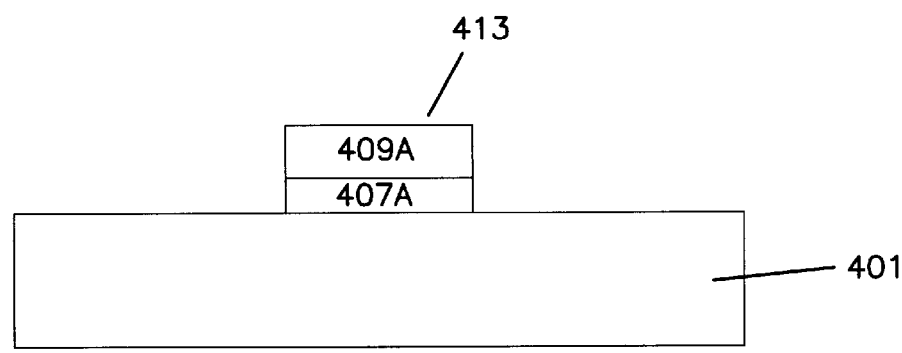

Following the formation of the thin high permittivity plug 407A, a conductive layer 409 is formed over the substrate 401, as illustrated in FIG. 4C. Portions of the conductive layer 409 are then removed to form a conductive plug 409A, as illustrated in FIG. 4D. Formation and removal of the conductive layer 409 may be done in a similar manner as discussed above with respect to conductive layer 211. The remaining portions of the oxide layer 403 are then removed, as illustrated in FIG. 4E. This oxide removal step may be performed in a similar manner as discussed above. The resultant structure comprises a gate electrode stack 413 which is formed by the thin high permittivity plug 407A (functioning as the gate insulating layer) and the conductive plug 409A (functioning as a gate electrode).

Fabrication may continue with well-known fabrication processes, such as spacer formation, source/drain region formation, contact formation and so forth to complete the ultimate device structure. In one example, the fabrication steps illustrated in FIGS. 2H and 2I are carried out to form an LDD device.

Using the above-described processes, a gate electrode stack may be formed using a pattern oxide layer and the advantages associated therewith can be obtained. In addition, the above processes allow the formation of a relatively thin (and typically planar) layer of high permittivity gate insulating material. The reduced thickness and increased planarity of the high permittivity gate insulating layer further increases device performance. For example, high permittivity gate insulating layers (such as BST oxide layers) can be controllably formed with thickness smaller than thicknesses resulting from a typical deposition process. For example, a uniform deposition of BST oxide typically cannot be performed below 200 Å. This allows for further scaling of the gate insulating layer thickness and concomitant increases in performance.

As noted above, the present invention is applicable to fabrication of a number of different devices where a gate electrode stack is formed using a patterned oxide layer. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art upon review of the present specification. The claims are intended to cover such modifications and devices.

We claim:

1. A process of forming a semiconductor device, comprising:
   forming an oxide layer over a surface of a substrate;
   forming at least one opening in the oxide layer;
   forming a high permittivity plug in a lower portion of the opening;
   forming a conductive plug in an upper portion of the opening over the high permittivity plug; and
   removing the oxide layer,
   wherein the high permittivity plug and the conductive plug are formed in contact with sidewalls of the oxide layer defining the opening.

2. The process of claim 1, wherein the oxide layer is formed by deposition.

3. The process of claim 1, wherein forming the at least one opening includes masking and etching a portion of the oxide layer.

4. The process of claim 1, wherein the oxide layer has a thickness ranging from 300 to 500 angstroms.

5. The process of claim 1, wherein the oxide layer opening has a width ranging from 0.15 to 0.25 microns or less.

6. A process of forming a semiconductor device, comprising:
   forming an oxide layer over a surface of a substrate;
   forming at least one opening in the oxide layer;
   forming a high permittivity plug in a lower portion of the opening;
   forming a conductive plug in an upper portion of the opening over the high permittivity plug; and
   removing the oxide layer;
   wherein forming the high permittivity plug in the opening includes:
      forming a high permittivity layer over the oxide layer; and
      overpolishing the high permittivity layer to form the high permittivity plug in the opening.

7. The process of claim 1, wherein forming the high permittivity plug in the opening includes:
   forming a high permittivity layer over the oxide layer;
   polishing the high permittivity layer to remove portions of the high permittivity layer over the oxide layer and leave a remaining portion of the high permittivity layer in the opening; and
   etching the remaining portion of the high permittivity layer to form the high permittivity plug in the opening.

8. The process of claim 1, wherein forming the high permittivity plug in the opening includes:
   forming a relatively planar high permittivity layer over the oxide layer; and
   etching the planar high permittivity layer to remove portions of the high permittivity layer over the oxide layer and leave a remaining portion of the high permittivity layer in the opening, the remaining portion of the high permittivity layer forming the high permittivity plug.

9. The process of claim 1, wherein forming the opening includes exposing an active region of the substrate.

10. The process of claim 1, wherein forming the conductive plug includes:
    forming a conductive layer over the oxide layer and high permittivity plug; and
    removing portions of the conductive layer over the oxide layer to leave a remaining portion of the conductive layer in the upper portion of the opening, the remaining portion of the conductive layer forming the conductive plug.

11. The process of claim 10, wherein removing portions of the conductive layer includes polishing the conductive layer.

12. The process of claim 10, wherein the remaining portion of the conductive layer is planarized with respect to an upper surface of the oxide layer.

13. The process of claim 1, wherein the conductive plug is formed from a metal silicide.

14. The process of claim 1, wherein the conductive plug is formed from polysilicon.

15. The process of claim 1, wherein the conductive plug is used as a gate electrode and the high permittivity plug is used as a gate insulating layer.

16. A process of fabricating a semiconductor device, comprising:
    forming an oxide layer over a surface of a substrate;
    masking and etching the oxide layer to form a patterned oxide layer having at least one opening therein;
    depositing a BST oxide layer over the patterned oxide layer to fill at least a portion of the opening;
    removing portions of the BST oxide layer to leave a remaining portion forming a recess within the opening;
    depositing a metal silicide layer over the patterned oxide layer and the remaining portion of the BST oxide layer, the metal silicide layer filling the recess within the opening;
    removing portions of the metal silicide layer over the oxide layer to planarize a remaining portion of the metal silicide layer with an upper surface of the oxide layer; and
    removing the patterned oxide layer;
    wherein the remaining portion of the BST oxide layer forms a gate insulating layer and the remaining portion of the metal silicide layer forms a gate electrode;
    wherein the remaining portion of BST oxide layer and the remaining portion of the metal silicide layer are in contact with sidewalls of the patterned oxide layer defining the opening.

17. The process of claim 1, wherein removing the oxide layer includes exposing sidewalls of the high permittivity plug and the conductive plug while leaving the exposed plugs intact.

18. The process of claim 17, further including forming spacers on the exposed sidewalls of the high permittivity plug and the conductive plug.

19. The process of claim 1, wherein removing the patterned oxide layer includes exposing sidewalls of the remaining portion of the BST oxide layer and the remaining portion of the metal silicide layer while leaving the exposed layers intact.

20. The process of claim 19, further including forming spacers on the exposed sidewalls of the remaining portion of the BST oxide layer and the remaining portion of the metal silicide layer.

21. The process of claim 16, wherein removing portions of the BST oxide layer includes overpolishing the BST oxide layer to leave the remaining portion of the BST oxide layer recessed with respect to an upper surface of the patterned oxide layer.

22. The process of claim 16, wherein removing portions of the BST oxide layer includes polishing the BST oxide layer to remove portions of the BST oxide layer deposited over the patterned oxide layer and, after polishing, etching the BST oxide layer to leave the remaining portion.

23. The process of claim 16, wherein depositing the BST oxide layer includes depositing the BST oxide layer to a thickness which provides a substantially planar upper surface and wherein removing portions of the BST oxide layer includes etching the relatively planar BST oxide layer to remove portions of the BST oxide layer over the patterned oxide layer and leave the remaining portion recessed within the opening.

24. A process of fabricating a semiconductor device, comprising:

forming, over a substrate, a patterned oxide layer defining at least one opening;

depositing a high permittivity layer, having a permittivity greater than silicon dioxide, over the patterned oxide layer to fill at least a portion of the opening, the deposited high permittivity layer being in contact with sidewalls of the opening;

removing portions of the high permittivity layer to leave a remaining portion in contact with sidewalls of the opening and recessed with respect to an upper surface of the patterned oxide layer;

depositing a metal silicide layer over the patterned oxide layer and the remaining portion of the high permittivity layer, the metal silicide layer being in contact with sidewalls of the opening and filling the recess within the opening;

removing portions of the metal silicide layer over the oxide layer to leave a remaining portion of the metal silicide layer within the opening over the remaining portion of the high permittivity layer and in contact with sidewalls of the opening;

removing the patterned oxide layer to expose sidewalls of, while leaving intact, the remaining portion of the high permittivity layer and the remaining portion of the metal silicide layer;

forming spacers on the exposed sidewalls of the remaining portions of the high permittivity layer and the metal silicide layer; and forming active regions adjacent the remaining portions of the high permittivity layer and the metal silicide layer.

* * * * *